United States Patent [19]
Mirow

[11] Patent Number: 5,359,303
[45] Date of Patent: * Oct. 25, 1994

[54] FET OSCILLATOR USING VOLTAGE AND TEMPERATURE COMPENSATED AMPLIFIER

[76] Inventor: Fred Mirow, 118 Cornell Rd., Bala Cynwyd, Pa. 19004

[*] Notice: The portion of the term of this patent subsequent to Aug. 31, 2010 has been disclaimed.

[21] Appl. No.: 71,778

[22] Filed: Jun. 4, 1993

Related U.S. Application Data

[63] Continuation of Ser. No. 952,194, Sep. 28, 1992, Pat. No. 5,241,286, which is a continuation of Ser. No. 751,122, Aug. 28, 1991, abandoned.

[51] Int. Cl.$^5$ .......................... H03B 5/24; H03L 1/02; H03K 5/13
[52] U.S. Cl. ..................... 331/176; 307/591; 307/603
[58] Field of Search ................. 331/57, 108 B, 135, 331/176, 136, 137; 330/289, 297, 127; 307/591, 594, 597, 603, 605, 296.1

[56] References Cited

U.S. PATENT DOCUMENTS

| | | | |
|---|---|---|---|
| 4,482,826 | 11/1984 | Ems et al. ......................... | 307/602 |
| 4,833,425 | 5/1989 | Culican, Sr. et al. ............. | 331/57 X |
| 5,241,286 | 8/1993 | Mirow .............................. | 331/176 X |

*Primary Examiner*—Davis Mis

[57] ABSTRACT

A Field Effect Transistor (FET) signal delay system with increased propagation delay time stability. This is accomplished by using a controlled voltage supply to power the amplifier stage. This voltage changes as the FET amplifier temperature increases in order to reduce the variation in propagation delay time, caused by the amplifier's gain and phase shift changes. By using this compensated amplifier as the delay element of a signal delay system, the propagation delay time stability is increased.

10 Claims, 1 Drawing Sheet

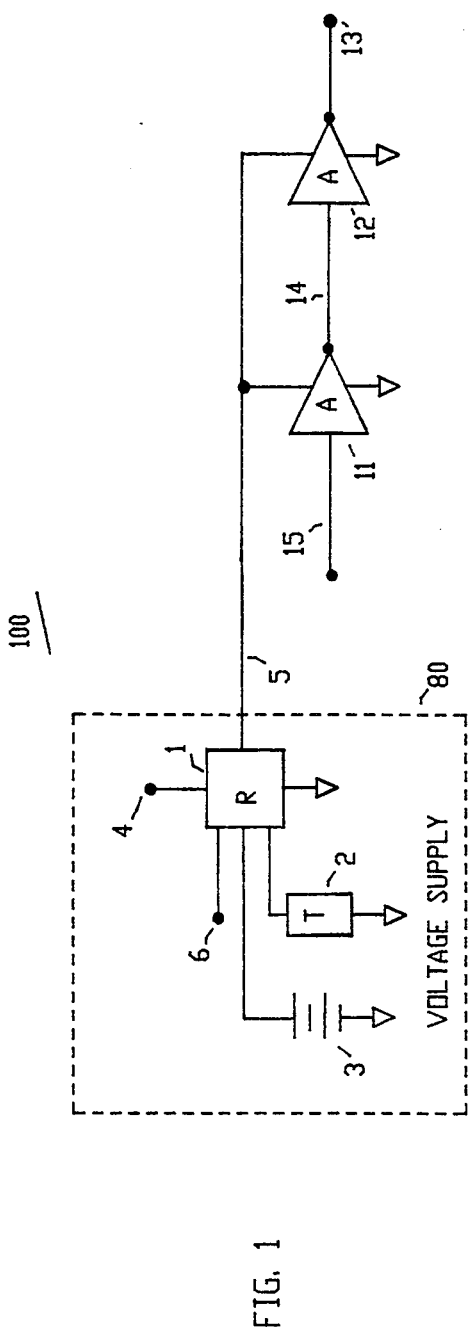
FIG. 1
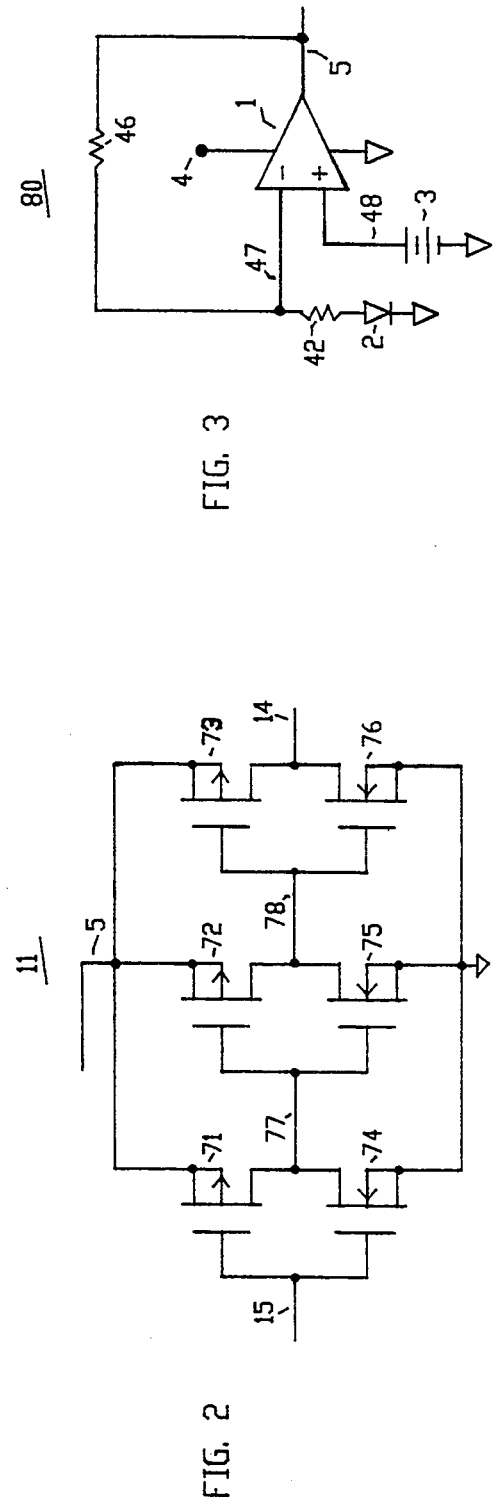
FIG. 3
FIG. 2

FET OSCILLATOR USING VOLTAGE AND TEMPERATURE COMPENSATED AMPLIFIER

This is a continuation of application Ser. No. 07/952,194, filed Sep. 28, 1992, U.S. Pat. No. 5,241,286, which was a continuation of application Ser. No. 07/751,122, filed Aug. 28, 1991, abandoned.

BACKGROUND ART

This invention relates to FET signal delay systems in which the propagation delay time is relatively independent of supply voltage and ambient temperature. The term FET is used to refer to CMOS, MOSFET, JFET and other variation of the Field Effect Transistor.

One of the problems associated with FET signal delay circuits is that the propagation delay time is very sensitive to changes in ambient temperature and power supply voltage. Propagation delay time is the time difference between the amplifier input signal and the resulting output signal. To reduce this instability some form of compensation is necessary.

SUMMARY OF THE INVENTION

The object of this invention is a FET signal delay system in which the propagation delay time stability is increased by reducing the change in the amplifier circuit gain and phase shift due to variations in ambient temperature and power supply voltage. This reduction is accomplished by powering the amplifier from a power supply in which the output voltage level varies with temperature.

Ideally the amplifier has stable gain and phase shift, or in the time domain propagation delay time. In practice the FET amplifier section has parameter variation with supply voltage and temperature. The FET parameter changes cause the amplifier gain and phase shift to change which in turn changes the propagation delay time.

Using this approach a signal delay system with variable propagation delay time can also be constructed by using a controlled voltage supply to power the amplifier. The voltage supply's output voltage level changes in response to temperature and also in response to an additional delay time control input signal.

BRIEF DESCRIPTION OF THE DRAWINGS

The invention will be described in detail hereinafter with reference to the accompanying drawings; in which FIG. 1 is a schematic representation of the circuit of the present invention;

FIG. 2 is a schematic representation of Amplifier 11;

FIG. 3 is a schematic representation of Voltage supply 80;

DETAILED DESCRIPTION OF THE INVENTION

Shown in FIG. 1 is compensated signal delay system 100 comprising amplifier 11, buffer amplifier 12, and voltage supply 80. Amplifier 11 does not have to be an invertor. Amplifier 11 phase shift and gain are effected by the voltage on line 5 and ambient temperature. Line 5 supplies the voltage to power the amplifier from voltage supply 80. The effect of temperature is that as the temperature increases the phase shift of amplifier 11 changes causing the propagation delay time to change. The effect of temperature on amplifier 11 is substantially canceled by changing the voltage on line 5. Thus the voltage on line 5 serves as a delay time control signal to adjust the propagation delay time of amplifier 11.

Voltage supply 80 consist of voltage regulator 1, voltage reference 3, and temperature sensor 2. Voltage regulator 1 receives unregulated DC voltage at terminal 4. The three input signals to voltage regulator 1 are voltage reference 3, temperature sensor 2, and the delay time control input signal received at terminal 6. Voltage regulator 1 output on line 5 is a DC voltage that is nominally set by voltage reference 3 and varies only in a controlled manner with the temperature change of temperature sensor 2 which is thermally coupled to amplifier 11 and the signal level change of the delay time control input signal. Voltage regulator 1 may use an operational amplifier or an other well known voltage regulator circuit. Temperature sensor 2 can be a diode or a temperature sensitive resistor. The ratio of line 5 voltage change to temperature change or the signal level change of the delay time control input signal is a set value determined by voltage supply 80 circuit values. With the delay time control input signal maintained at a constant value, as the temperature of amplifier 11 varies the output signal of temperature sensor 2 causes the voltage on line 5 to vary in a direction to maintain the propagation delay time nearly constant. Thus, voltage variations on line 5 compensate for propagation delay time variations caused by changes in temperature.

Buffer amplifier 12 provides isolation between the output terminal 13 and the signal on line 14. It may be overdriven to provide a square wave output signal. The voltage to power this amplifier may come from terminal 4 instead of line 5.

Referring now to FIG. 2 a practical means of implementing amplifier 11 is shown. The amplifier uses CMOS and is well known by those skilled in the art. Transistors 71 through 73 are PMOS and 74 through 76 are NMOS. The PMOS and NMOS transistors exhibit essentially identical, but complemented characteristics. The input signal on line 15 is placed on the gates of transistors 71 and 74. The amplified and inverted output signal on line 77 is connected to the next stage's input, the gates of transistor 72 and 75. The amplified and inverted output signal on line 78 is connected to the next stage's input, the gates of transistor 73 and 76. The amplified and inverted output signal of this stage is on line 14. The voltage to power each amplifier stage is supplied by line 5.

Referring now to FIG. 3, a practical means of implementing voltage supply 80 is shown. Operational amplifier 1 receives unregulated voltage at terminal 4. Amplifier 1 maintains the voltage level on line 5 at a value that makes the voltage level on line 47 equal to that on line 48. The voltage on line 48 is a fixed value determined by voltage reference 3. The voltage on line 47 is a ratio of the voltage on line 5. The ratio is determined by the value of resistors 42 and 46 and the forward voltage drop of diode 2. The diode 2 performs the function of temperature sensor 2. The forward voltage drop of the diode decreases as it's temperature increases causing the voltage on line 5 to increase. Diode 2 is thermally connected to Amplifier 11 so that they are both essentially at the same temperature. As the temperature of Amplifier 11 increases the voltage of line 5 also increases.

Diode 2 is not needed if resistor 46 is made of temperature sensitive material such as doped silicon. This resistor can be formed on the same substrate as Amplifier 11 transistors to provide good thermal coupling. When resistor 46 is used as the temperature sensor 2, diode 2 is removed from the circuit and the terminal of resistor 42 that was connected to diode 2 now is connected to ground.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the appended claims.

I claim:

1. A field effect transistor (FET) oscillator system having an oscillator with an active amplifier element and a feedback network, said an oscillator having oscillator output frequency and receiving a frequency control signal, said oscillator output frequency having first frequency variations induced by temperature variations and second frequency variations induced by variations in said frequency control signal, comprising:

temperature means for providing a temperature signal level in accordance with temperature;

reference means for providing a reference voltage level adjusting means for receiving the reference voltage level and the temperature signal level to provide the variations of said frequency control signal in accordance with said reference voltage level and said temperature signal level;

means within said amplifier element for receiving said frequency control signal to induce said second frequency variations; and, said second frequency variations compensating said first frequency variations to provide a constant oscillator output frequency.

2. A field effect transistor (FET) signal delay system having an amplifier having an amplifier element, said amplifier having a delay time between signal input and signal output and receiving a delay time control signal, said amplifier delay time having first propagation delay time variations induced by temperature variations and second propagation delay time variations induced by said delay time control signal, comprising:

temperature means for providing a temperature signal level in accordance with temperature;

reference means for providing a reference voltage level independent of temperature;

adjusting means for receiving the reference voltage level and the temperature signal level to provide the variations of said delay time control signal in accordance with said reference voltage level and said temperature signal level;

means within said amplifier element for receiving said delay time control signal to induce said second propagation delay time variations; and, said second propagation delay time variations compensating said first propagation delay time variations to provide a constant amplifier propagation delay time.

3. The field effect transistor (FET) signal delay system of claim 2, wherein said delay time control signal is a voltage level.

4. The field effect transistor (FET) signal delay system of claim 3, wherein said amplifier comprises a CMOS amplifier.

5. The field effect transistor (FET) signal delay system of claim 2, wherein said temperature means comprises a diode.

6. The field effect transistor (FET) signal delay system of claim 2, wherein said temperature means comprises a temperature sensitive resistor.

7. The field effect transistor (FET) signal delay system of claim 2, wherein said adjusting means comprises delay time control signal feedback means for applying said delay time control signal to said adjusting means and feedback control signal providing means for determining said delay time control signal in accordance with said feedback control signal.

8. The field effect transistor (FET) signal delay system of claim 2, further comprising delay time control signal means for adjusting said delay time control signal in accordance with a further delay time control input signal.

9. The field effect transistor (FET) signal delay system having an amplifier having an amplifier element, said amplifier having a delay time between signal input and signal output and receiving a delay time control signal, said amplifier delay time having first propagation delay time variations induced by temperature variations and second propagation delay time variations induced by said delay time control signal, comprising:

temperature means for providing a temperature signal level in accordance with temperature;

adjusting means for receiving the temperature signal level to provide the variations of said delay time control signal in accordance with said temperature signal level;

said adjusting means having delay time control signal feedback means for applying said delay time control signal to said adjusting means and feedback control signal providing means for determining said delay time control signal in accordance with said feedback control signal;

means within said amplifier element for receiving said delay time control signal to induce said second delay time variations; and, said second propagation delay time variations compensating said first propagation delay time variations to provide a constant amplifier propagation delay time.

10. The field effect transistor (FET) signal delay system of claim 9, wherein said amplifier comprises a CMOS amplifier.

* * * * *